(12) United States Patent
Lin

(10) Patent No.: US 9,154,118 B1
(45) Date of Patent: Oct. 6, 2015

(54) PULSE DELAY CIRCUIT

(71) Applicant: eMemory Technology Inc., Hsin-Chu (TW)

(72) Inventor: Huan-Min Lin, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 57 days.

(21) Appl. No.: 14/250,076

(22) Filed: Apr. 10, 2014

(51) Int. Cl.
*H03K 5/13* (2014.01)
*H03K 5/14* (2014.01)
*H03K 5/01* (2006.01)

(52) U.S. Cl.
CPC ... *H03K 5/14* (2013.01); *H03K 5/01* (2013.01)

(58) Field of Classification Search
USPC .................. 327/262, 264, 285, 293, 299
See application file for complete search history.

(56) References Cited

U.S. PATENT DOCUMENTS

| 3,569,842 A | 3/1971 | Schroyer |
| RE31,551 E | 4/1984 | Bjorke |
| 5,731,724 A | 3/1998 | Grishakov et al. |
| 6,242,960 B1 * | 6/2001 | Bae ................................. 327/299 |

FOREIGN PATENT DOCUMENTS

CN  101472370 A  7/2009

* cited by examiner

*Primary Examiner* — An Luu
(74) *Attorney, Agent, or Firm* — WPAT, PC; Justin King

(57) ABSTRACT

A pulse delay circuit includes a pull down element, a first pull up element, a first delay unit, a second delay unit, a second pull up element, and an inverted buffer. The pull down element is connected to an input pulse signal, a node b and a first voltage. The first pull up element is connected to a node c, a second voltage and the node b. The first delay unit has a reset terminal. The first delay unit is connected to the node b and the node c. The second delay unit is connected to the node c and the node d. The second pull up element is connected to the node d, the second voltage and the node c. The inverted buffer is connected to the node c and the reset terminal. Moreover, a delayed pulse signal is outputted from the inverted buffer.

9 Claims, 4 Drawing Sheets

US 9,154,118 B1

PULSE DELAY CIRCUIT

FIELD OF THE INVENTION

The present invention relates to a delay circuit, and more particularly to a pulse delay circuit.

BACKGROUND OF THE INVENTION

Generally, a delay circuit is widely used for delaying an input signal for a specified time interval, thereby generating an output signal. For example, after a pulse signal is inputted into the delay circuit, a delayed pulse signal is outputted from the delay circuit after the specified time interval.

However, if the pulse width of the pulse signal is very narrow (i.e. smaller than the specified time interval), the waveform of the delayed pulse signal from the delay circuit is suffered from serious distortion.

FIG. 1 is a schematic functional diagram illustrating a conventional pulse delay circuit. As shown in FIG. 1, the conventional pulse delay circuit 100 comprises a rising trigger 102, a first delay unit 104, a falling trigger 106, and a second delay unit 108.

An input pulse signal Pin is received by the rising trigger 102 and the falling trigger 106. The rising trigger 102 generates a first triggering signal Tr at a rising edge of the input pulse signal Pin. Moreover, the first triggering signal Tr is transmitted to the first delay unit 104. The falling trigger 106 generates a second triggering signal Tf at a falling edge of the input pulse signal Pin. Moreover, the second triggering signal Tf is transmitted to the second delay unit 108.

After the first triggering signal Tr is delayed for a specified time interval by the first delay unit 104 and the second triggering signal Tf is delayed for the specified time interval by the second delay unit 108, the delayed first triggering signal Tr and the delayed second triggering signal Tf are combined as a delayed pulse signal Pout.

FIG. 2 is a schematic functional diagram illustrating another conventional pulse delay circuit. As shown in FIG. 2, the conventional pulse delay circuit 200 comprises a delay unit 202 and a monostable multivibrator 204. After an input signal Pin is received by the delay unit 202, a delayed input signal Pin_d is generated. After the delayed input signal Pin_d is received by the monostable multivibrator 204, a delayed pulse signal Pout is generated.

Generally, the waveform of the delayed input signal Pin_d may be suffered from distortion. Moreover, after the monostable multivibrator 204 is triggered by the delayed input signal Pin_d, the waveform of the delayed pulse signal Pout from the monostable multivibrator 204 is no longer suffered from distortion.

However, since the circuitry of the monostable multivibrator 204 is very complicated, the layout size of the monostable multivibrator 204 in the integrated circuit design is very large.

SUMMARY OF THE INVENTION

The present invention provides a pulse delay circuit with a novel circuitry configuration and a smaller layout size.

An embodiment of the present invention provides a pulse delay circuit. The pulse delay circuit includes a pull down element, a first pull up element, a first delay unit, a second delay unit, a second pull up element, and an inverted buffer. The pull down element has a control terminal receiving an input pulse signal, a first terminal connected to a node b, and a second terminal receiving a first voltage. The first pull up element has a control terminal connected to a node c, a first terminal connected to a second voltage, and a second end connected to the node b. The first delay unit has a reset terminal. An input terminal of the first delay unit is connected to the node b, and an output terminal of the first delay unit is connected to the node c. The second delay unit has an input terminal connected to the node c and an output terminal connected to a node d. The second pull up element has a control terminal connected to the node d, a first terminal connected to the second voltage, and a second terminal connected to the node c. The inverted buffer has an input terminal connected to the node c and an output terminal connected to the reset terminal of the first delay unit. Moreover, a delayed pulse signal is outputted from the inverted buffer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
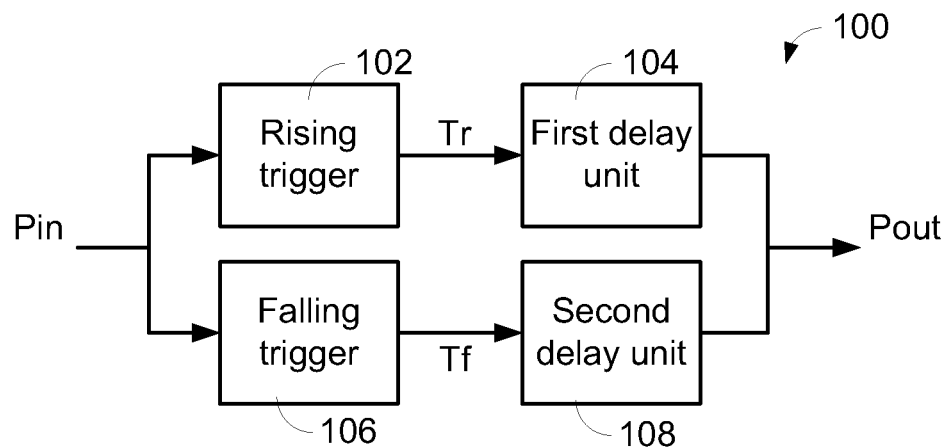
FIG. 1 (prior art) is a schematic functional diagram illustrating a conventional pulse delay circuit.
Figure 2:
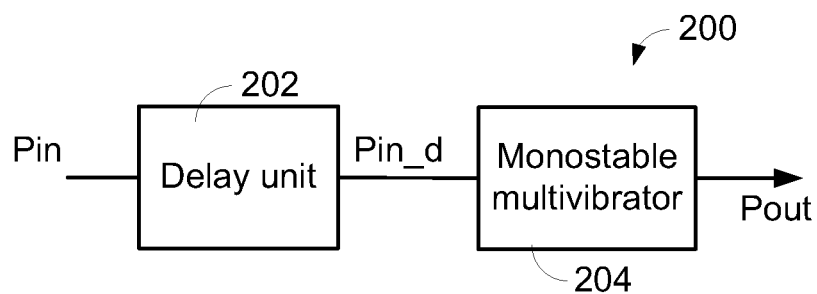
FIG. 2 (prior art) is a schematic functional diagram illustrating another conventional pulse delay circuit.
Figure 3A:
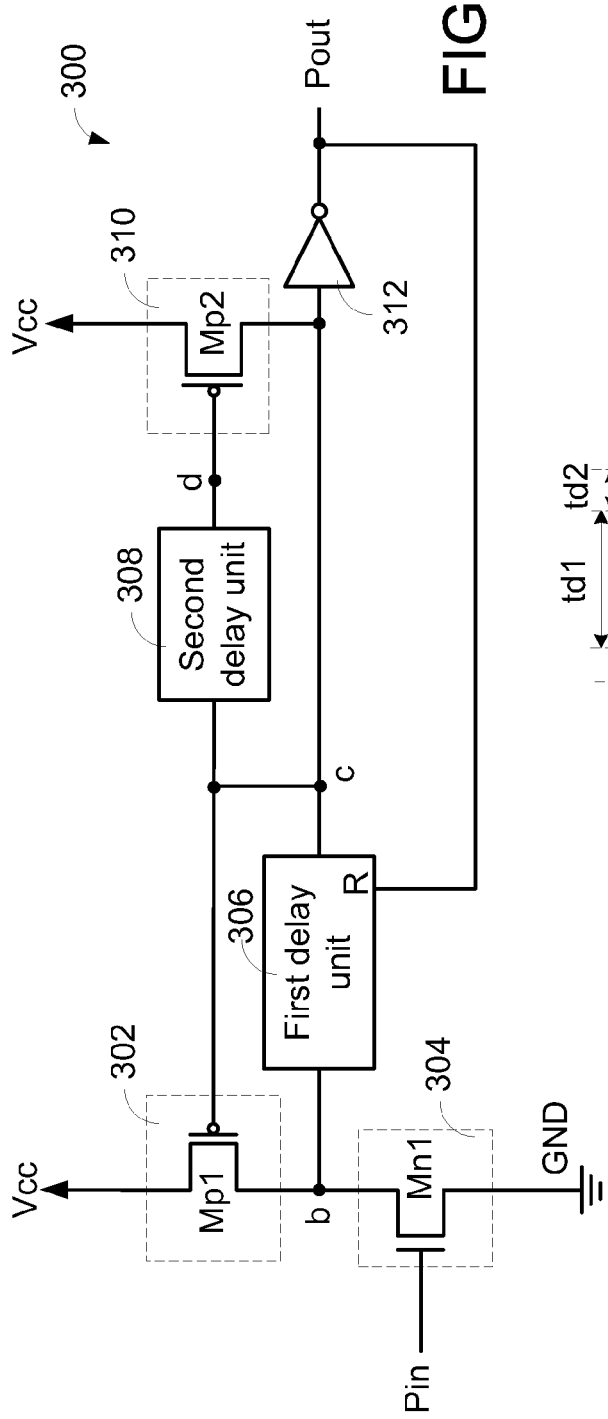
FIG. 3A is a schematic circuit diagram illustrating a pulse delay circuit according to an embodiment of the present invention.
Figure 3B:
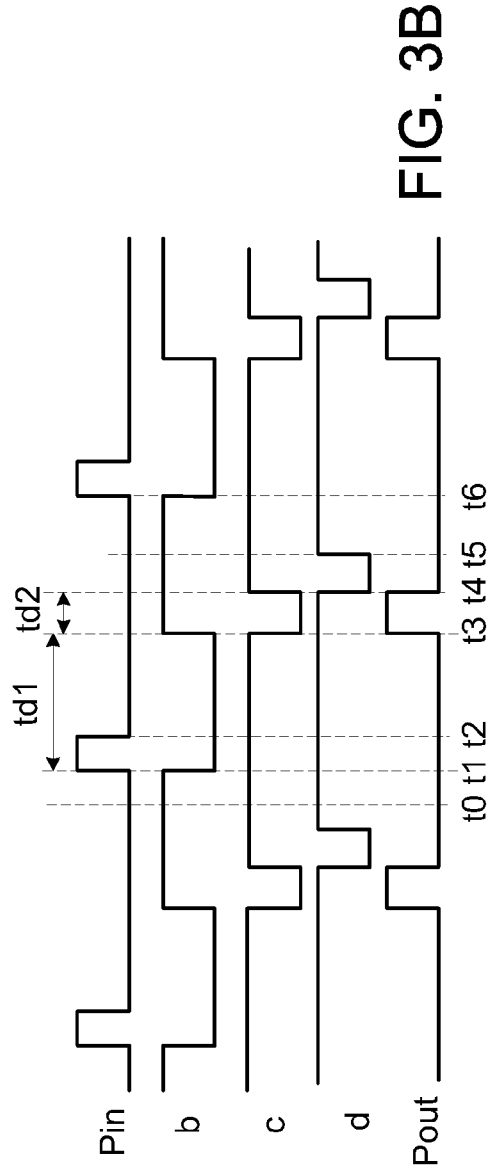
FIG. 3B is a schematic timing waveform diagram illustrating associated signals processed by the pulse delay circuit of FIG. 3A.

FIG. 3A is a schematic circuit diagram illustrating a pulse delay circuit according to an embodiment of the present invention. FIG. 3B is a schematic timing waveform diagram illustrating associated signals processed by the pulse delay circuit of FIG. 3A. The pulse delay circuit 300 comprises a first pull up element 302, a pull down element 304, a first delay unit 306, a second delay unit 308, a second pull up element 310, and an inverter 312.

A control terminal of the pull down element 304 receives an input pulse signal Pin. A first terminal of the pull down element 304 is connected to a node b. A second terminal of the pull down element 304 is connected to a ground terminal (or a ground voltage) GND. A control terminal of the first pull up element 302 is connected to a node c. A first terminal of the first pull up element 302 is connected to a power supply voltage Vcc. A second terminal of the first pull up element 302 is connected to a node b. The first delay unit 306 has a reset terminal R. An input terminal of the first delay unit 306 is connected to the node b. An output terminal of the first delay unit 306 is connected to the node c. An input terminal of the second delay unit 308 is connected to the node c. An output terminal of the second delay unit 308 is connected to a node d. A control terminal of the second pull up element 310 is connected to the node d. A first terminal of the second pull up element 310 is connected to the power supply voltage Vcc. A second terminal of the second pull up element 310 is connected to the node c. An input terminal of the inverter 312 is connected to the node c. An output terminal of the inverter 312 is connected to the reset terminal R of the first delay unit 306. Moreover, a delayed pulse signal Pout is outputted from the inverter 312. In other embodiments, the inverter 312 can be replaced by an inverted buffer which has three series inverters or five series invertors to more sharpen the delayed pulsed signal Pout.

In this embodiment, the pull down element 304 is an N-type transistor Mn1. The gate terminal of the N-type transistor Mn1 is the control terminal of the pull down element 304. The drain terminal of the N-type transistor Mn1 is the first terminal of the pull down element 304. The source terminal of the N-type transistor Mn1 is the second terminal of the pull down element 304. In this embodiment, the first pull up element 302 is a P-type transistor Mp1. The gate terminal of the P-type transistor Mp1 is the control terminal of the first pull up element 302. The source terminal of the P-type transistor Mp1 is the first terminal of the first pull up element 302. The drain terminal of the P-type transistor Mp1 is the second terminal of the first pull up element 302. In this embodiment, the second pull up element 310 is also a P-type transistor Mp2. The gate terminal of the P-type transistor Mp2 is the control terminal of the second pull up element 310. The source terminal of the P-type transistor Mp2 is the first terminal of the second pull up element 310. The drain terminal of the P-type transistor Mp2 is the second terminal of the second pull up element 310.

When the reset terminal R of the first delay unit 306 receives a high-level signal, the first delay unit 306 is reset and cannot be normally operated. When the reset terminal R of the first delay unit 306 receives a low-level signal, the first delay unit 306 can be normally operated. After the signal at the node b is delayed for a first delay time td1 by the first delay unit 306, the delayed signal from the first delay unit 306 becomes the signal at the node c.

The second delay unit 308 has no reset terminal. Consequently, the second delay unit 308 is continuously in the normal operating status. After the signal at the node c is delayed for a second delay time td2 by the second delay unit 308, the delayed signal from the second delay unit 308 becomes the signal at the node d.

Please refer to FIG. 3B. At the time point t0, the input pulse signal Pin is in the low-level state, the signals at the nodes b, c and d are in the high-level state, and the delayed pulse signal Pout is in the low-level state. The power supply voltage Vcc may be considered as a high-level voltage, and the ground voltage GND may be considered as a low-level voltage.

At the time point t1, the input pulse signal Pin is switched from the low-level state to the high-level state. Meanwhile, the pull down element 304 is enabled, and the signal at the node b is pulled down from the high-level state to the low-level voltage by the pull down element 304. Moreover, the signals at nodes c and d are maintained in the high-level state, and the delayed pulse signal Pout is maintained in the low-level state.

At the time point t2, the input pulse signal Pin is switched from the high-level state to the low-level state. Meanwhile, the pull down element 304 is disabled. Moreover, the signals at nodes c and d are maintained in the high-level state, and the delayed pulse signal Pout is maintained in the low-level state.

By the first delay unit 306, the falling edge of the signal at the node b is delayed for the first delay time td1. Consequently, at the time point t3 (i.e. the time point t1 plus the first delay time td1), the signal at the node c is switched from the high-level state to the low-level state. Meanwhile, the first pull up element 302 is enabled. Consequently, the signal at the node b is pulled up from the low-level state to the high-level voltage by the first pull up element 302. In addition, the delayed pulse signal Pout outputted from the inverter 312 is switched from the low-level state to the high-level state. Under this circumstance, the first delay unit 306 is reset. The signal at the node d is maintained in the high-level state.

By the second delay unit 308, the falling edge of the signal at the node c is delayed for the second delay time td2. Consequently, at the time point t4 (i.e. the time point t3 plus the second delay time td2), the signal at the node d is switched from the high-level state to the low-level state. Since the signal at the node d is in the low-level state, the second pull up element 310 is enabled. Consequently, the signal at the node c is pulled up from the low-level state to the high-level voltage by the second pull up element 310. In addition, the delayed pulse signal Pout outputted from the inverter 312 is switched from the high-level state to the low-level state. Under this circumstance, the first delay unit 306 can be normally operated. The signal at the node b is maintained in the high-level state.

At the time point t5, the signal at the node d is switched from the low-level state to the high-level voltage. Moreover, the signals at nodes b and c are maintained in the high-level state, and the delayed pulse signal Pout is maintained in the low-level state.

At the time point t6, the input pulse signal Pin is switched from the high-level state to the low-level state. The operations are similar to those at the time point t1, and are not redundantly described.

From the above discussions about the pulse delay circuit 300, the pull down element 304 is enabled in response to the rising edge of the input pulse signal Pin. Consequently, the pulse delay circuit 300 starts to generate the delayed pulse signal Pout.

Moreover, the time difference between the input pulse signal Pin and the delayed pulse signal Pout is equal to the first delay time td1. The first delay time td1 is adjusted by the first delay unit 306.

Moreover, the pulse width of the delayed pulse signal Pout is equal to the second delay time td2. That is, the pulse width of the delayed pulse signal Pout is adjusted by the second delay unit 308.

Figure 4A:
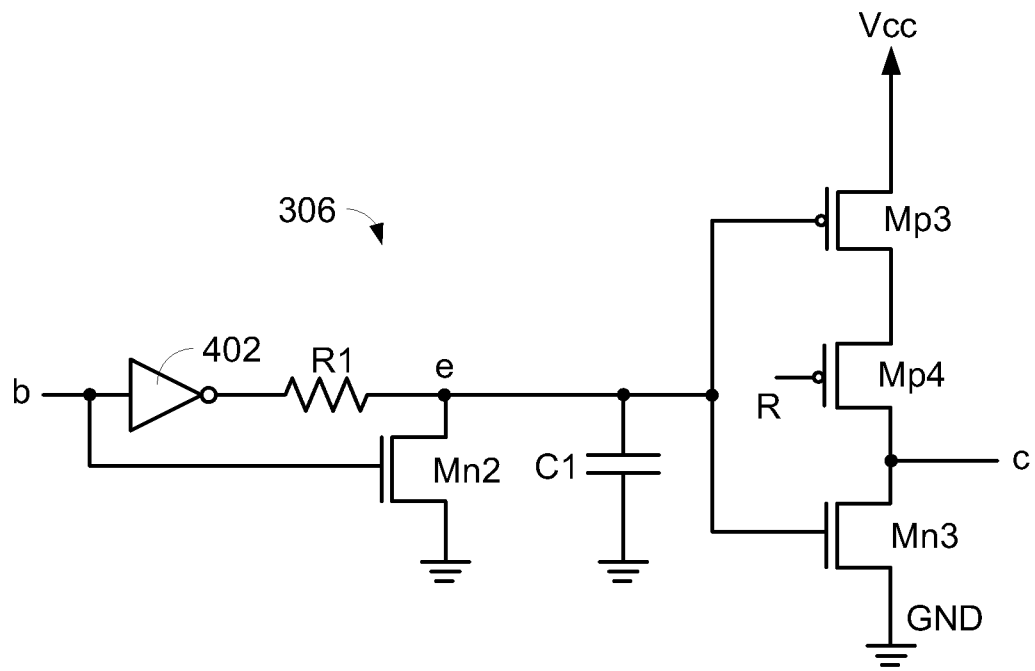
FIG. 4A is a schematic circuit diagram illustrating the first delay unit of the pulse delay circuit according to the embodiment of the present invention.
Figure 4B:
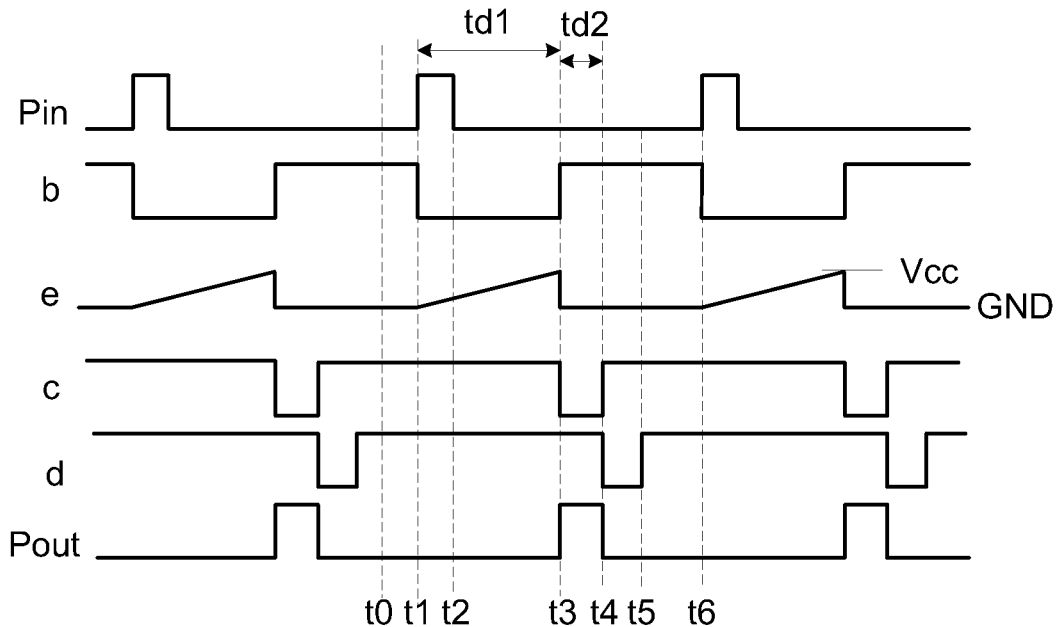
FIG. 4B is a schematic timing waveform diagram illustrating associated signals processed by the first delay unit of FIG. 4A.

FIG. 4A is a schematic circuit diagram illustrating the first delay unit of the pulse delay circuit according to the embodiment of the present invention. FIG. 4B is a schematic timing waveform diagram illustrating associated signals processed by the first delay unit of FIG. 4A.

As shown in FIG. 4A, the first delay unit 306 comprises an inverter 402, a resistor R1, a capacitor C1, two N-type transistors Mn2, Mn3, and two P-type transistors Mp3, Mp4. The magnitude of the first delay time td1 may be determined according to the resistance value of the resistor R1 and the capacitance value of the capacitor C1.

An input terminal of the inverter 402 is connected to the node b. An output terminal of the inverter 402 is connected to a first end of the resistor R1. A second end of the resistor R1 is connected to a node e. The drain terminal of the N-type transistor Mn2 is connected to the node e. The gate terminal of the N-type transistor Mn2 is connected to the node b. The source terminal of the N-type transistor Mn2 is connected to the ground terminal GND. The capacitor C1 is connected between the node e and the ground terminal GND. The source terminal of the P-type transistor Mp3 is connected to the power supply voltage Vcc. The gate terminal of the P-type transistor Mp3 is connected to the node e. The source terminal of the P-type transistor Mp4 is connected to the drain terminal of the P-type transistor Mp3. The gate terminal of the P-type transistor Mp4 is the reset terminal of the first delay unit 306. The drain terminal of the P-type transistor Mp4 is connected to the node c. The drain terminal of the N-type transistors Mn3 is connected to the node c. The gate terminal of the N-type transistors Mn3 is connected to the node e. The source terminal of the N-type transistors Mn3 is connected to the ground terminal GND.

Please refer to FIG. 4B. At the time point t1, the first delay unit 306 can be normally operated. Meanwhile, the signal at the node b is switched from the high-level state to the low-level voltage, the N-type transistor Mn2 is turned off, and the signal at the output terminal of the inverter 402 is switched to the high-level state. Moreover, a charging current is outputted from the output terminal of the inverter 402. The charging current is transmitted to the capacitor C1 through the resistor R1. Consequently, the voltage at the node e is gradually increased from the ground voltage GND. Under this circumstance, the P-type transistor Mp4 is turned on, the N-type transistor Mn3 is turned off, and the node at the node c is maintained in the high-level state.

At the time point t3, the voltage at the node e is gradually increased to the power supply voltage Vcc. Consequently, the N-type transistors Mn3 is turned on, the P-type transistor Mp4 is turned off, and the signal at the node c is switched from the high-level state to the low-level voltage. Moreover, since the signal at the node b is switched form the low-level state to the high-level voltage, the N-type transistor Mn2 is turned on, and the voltage at the node e is decreased to the ground voltage GND. In other words, the voltage at the node e is changed between the ground voltage GND and the power supply voltage Vcc according to the voltage change of the node b.

Moreover, the actions of the input pulse signal Pin, the signals at the nodes b, c and d and the delayed pulse signal Pout are similar to those of FIG. 3B, and are not redundantly described herein.

Figure 5A:
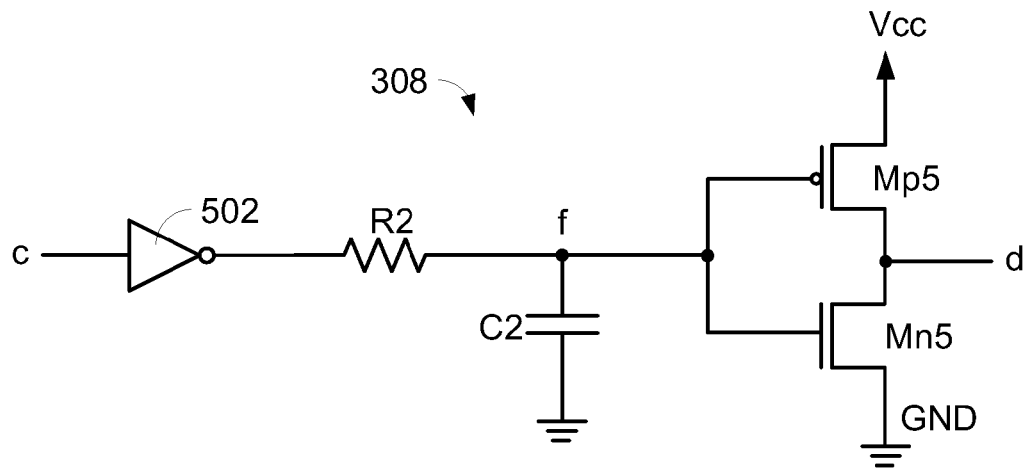
FIG. 5A is a schematic circuit diagram illustrating the second delay unit of the pulse delay circuit according to the embodiment of the present invention.
Figure 5B:
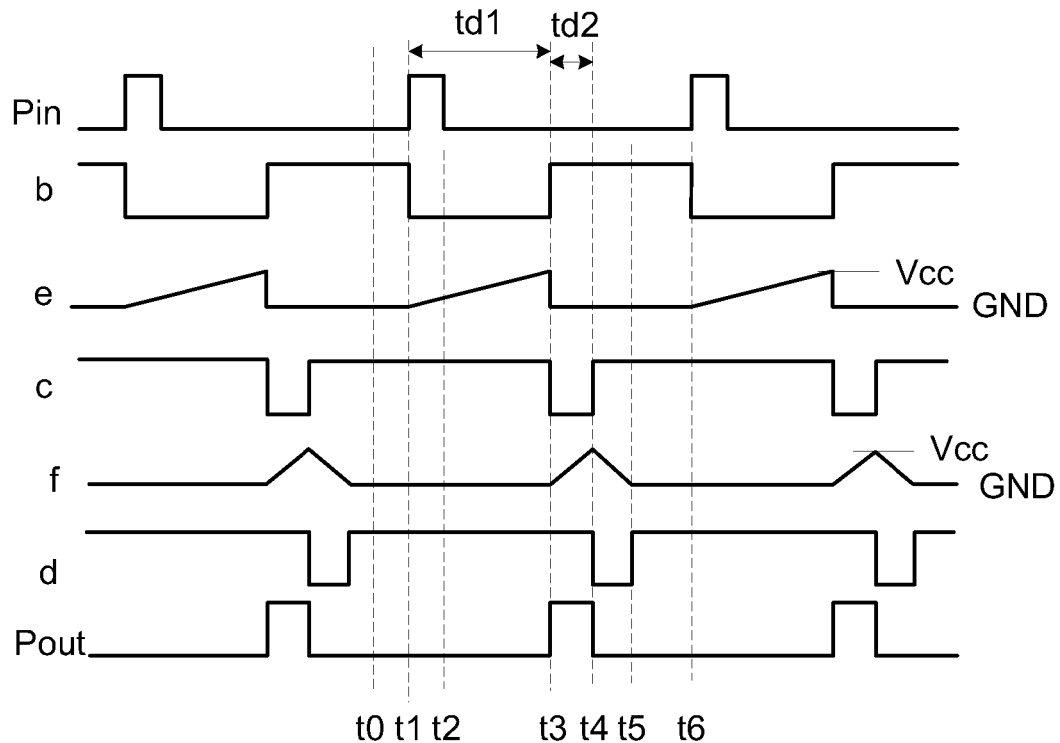
FIG. 5B is a schematic timing waveform diagram illustrating associated signals processed by the second delay unit of FIG. 5A.

FIG. 5A is a schematic circuit diagram illustrating the second delay unit of the pulse delay circuit according to the embodiment of the present invention. FIG. 5B is a schematic timing waveform diagram illustrating associated signals processed by the second delay unit of FIG. 5A.

As shown in FIG. 5A, the second delay unit 308 comprises an inverter 502, a resistor R2, a capacitor C2, an N-type transistor Mn5 and a P-type transistor Mp5. The magnitude of the second delay time td2 may be determined according to the resistance value of the resistor R2 and the capacitance value of the capacitor C2.

An input terminal of the inverter 502 is connected to the node c. An output terminal of the inverter 502 is connected to a first end of the resistor R2. A second end of the resistor R2 is connected to a node f. The capacitor C2 is connected between the node f and the ground terminal GND. The source terminal of the P-type transistor Mp5 is connected to the power supply voltage Vcc. The gate terminal of the P-type transistor Mp5 is connected to the node f. The drain terminal of the P-type transistor Mp5 is connected to the node d. The drain terminal of the N-type transistor Mn5 is connected to the node d. The gate terminal of the N-type transistor Mn5 is connected to the node f. The source terminal of the N-type transistor Mn5 is connected to the ground terminal GND.

Please refer to FIG. 5B. At the time point t3, the signal at the node c is switched from the high-level state to the low-level voltage, and the signal at the output terminal of the inverter 502 is switched to the high-level state. Moreover, a charging current is outputted from the output terminal of the inverter 502. The charging current is transmitted to the capacitor C2 through the resistor R2. Consequently, the voltage at the node f is gradually increased. Under this circumstance, the P-type transistor Mp5 is turned on, the N-type transistor Mn5 is turned off, and the node at the node d is maintained in the high-level state.

At the time point t4, the voltage at the node f is gradually increased to the power supply voltage Vcc. Consequently, the N-type transistors Mn5 is turned on, the P-type transistor Mp5 is turned off, and the signal at the node d is switched from the high-level state to the low-level voltage. Moreover, since the signal at the node c is switched form the low-level state to the high-level voltage, the signal at the output terminal of the inverter 502 is switched to the low-level state. Meanwhile, a discharging current is outputted from the capacitor C2, and the discharging current is transmitted to the output terminal of the inverter 502. Consequently, the voltage at the node f is gradually decreased.

At the time point t5, the voltage at the node f is decreased to the ground voltage GND. Consequently, the P-type transistor Mp5 is turned on, the N-type transistors Mn5 is turned off, and the signal at the node d is switched from the low-level state to the high-level voltage. In other words, the voltage at the node f is changed between the power supply voltage Vcc and the ground voltage GND according to the voltage change of the node c.

Moreover, the actions of the input pulse signal Pin, the signals at the nodes b, c, d and e the delayed pulse signal Pout are similar to those of FIG. 4B, and are not redundantly described herein.

From the above descriptions, the present invention provides a pulse delay circuit. The pulse delay circuit of the present invention has simplified circuitry and reduced layout size. The magnitude of the first delay time td1 may be adjusted by the first delay unit 306 according to the resistance value of the resistor R1 and the capacitance value of the capacitor C1. The magnitude of the second delay time td2 may be adjusted by the second delay unit 308 according to the resistance value of the resistor R2 and the capacitance value of the capacitor C2. Moreover, the delay time of the delayed pulse is determined by the first delay unit 306 and the pulse width of the delay pulse is determined by the second delay unit 308.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A pulse delay circuit, comprising:
   a pull down element having a control terminal receiving an input pulse signal, a first terminal connected to a node b, and a second terminal receiving a first voltage;
   a first pull up element having a control terminal connected to a node c, a first terminal connected to a second voltage, and a second terminal connected to the node b;
   a first delay unit having a reset terminal, wherein an input terminal of the first delay unit is connected to the node b, and an output terminal of the first delay unit is connected to the node c;
   a second delay unit having an input terminal connected to the node c and an output terminal connected to a node d;
   a second pull up element having a control terminal connected to the node d, a first terminal connected to the second voltage, and a second terminal connected to the node c; and
   an inverted buffer having an input terminal connected to the node c and an output terminal connected to the reset terminal of the first delay unit, wherein a delayed pulse signal is outputted from the inverted buffer.

2. The pulse delay circuit as claimed in claim 1, wherein the pull down element is a first N-type transistor, wherein a gate terminal of the first N-type transistor receives the input pulse signal, a source terminal of the first N-type transistor receives the first voltage, and a drain terminal of the first N-type transistor is connected to the node b.

3. The pulse delay circuit as claimed in claim 2, wherein the first pull up element is a first P-type transistor, wherein a gate terminal of the first P-type transistor is connected to the node c, a source terminal of the first P-type transistor connected to the second voltage, and a drain terminal of the first P-type transistor is connected to the node b.

4. The pulse delay circuit as claimed in claim 3, wherein the second pull up element is a second P-type transistor, wherein a gate terminal of the second P-type transistor Mp2 is connected to the node d, a source terminal of the second P-type transistor is connected to the second voltage, and a drain terminal of the second P-type transistor is connected to the node c, wherein the first voltage is a ground voltage, and the second voltage is power supply voltage.

5. The pulse delay circuit as claimed in claim 1, wherein a falling edge of a signal at the node b is delayed for a first delay time by the first delay unit, and a falling edge of a signal at the node c is delayed for a second delay time by the second delay unit.

6. The pulse delay circuit as claimed in claim 5, wherein the first delay unit comprises:
   an inverter having an input terminal and an output terminal, wherein the input terminal of the inverter is connected to the node b;
   a resistor connected between the output terminal of the inverter and a node e;
   a first N-type transistor having a drain terminal connected to the node e, a gate terminal connected to the node b, and a source terminal receiving the first voltage;
   a capacitor connected between the node e and the first voltage;
   a first P-type transistor having a source terminal connected to the second voltage and a gate terminal connected to the node e;
   a second P-type transistor having a source terminal connected to a drain terminal of the first P-type transistor, a gate terminal serving as the reset terminal, and a drain terminal connected to the node c; and
   a second N-type transistor having a drain terminal connected to the node c, a gate terminal connected to the node e, and a source terminal receiving the first voltage.

7. The pulse delay circuit as claimed in claim 6, wherein the first voltage is a ground voltage, and the second voltage is a power supply voltage, wherein the first delay time is adjusted by changing a resistance value of the resistor and a capacitance value of the capacitor.

8. The pulse delay circuit as claimed in claim 5, wherein the second delay unit comprises:
   an inverter having an input terminal and an output terminal, wherein the input terminal of the inverter is connected to the node c;
   a resistor connected between the output terminal of the inverter and a node f;
   a capacitor connected between the node f and the first voltage;
   a P-type transistor having a source terminal connected to the second voltage, a gate terminal connected to the node f, and a drain terminal connected to the node d; and
   an N-type transistor having a drain terminal connected to the node d, a gate terminal connected to the node f, and a source terminal receiving the first voltage.

9. The pulse delay circuit as claimed in claim 8, wherein the first voltage is a ground voltage, and the second voltage is a power supply voltage, wherein the second delay time is adjusted by changing a resistance value of the resistor and a capacitance value of the capacitor.

* * * * *